(12) United States Patent
Li et al.

(10) Patent No.: US 11,495,602 B1
(45) Date of Patent: Nov. 8, 2022

(54) METHOD AND DEVICE FOR DETERMINING FABRICATION CHAMBER

(71) Applicant: CHANGXIN MEMORY TECHNOLOGIES, INC., Hefei (CN)

(72) Inventors: Zhenxing Li, Hefei (CN); Yuming Wang, Hefei (CN); Fang Wang, Hefei (CN); San-Chen Chen, Hefei (CN); Chen-Hua Shen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/647,737

(22) Filed: Jan. 12, 2022

Related U.S. Application Data

(63) Continuation of application No. PCT/CN2021/113178, filed on Aug. 18, 2021.

(30) Foreign Application Priority Data

Aug. 12, 2021 (CN) .......................... 202110925197.X

(51) Int. Cl.
  *H01L 27/108* (2006.01)
  *H01L 21/67* (2006.01)
  *H01L 21/306* (2006.01)

(52) U.S. Cl.
  CPC ........ *H01L 27/1085* (2013.01); *H01L 21/306* (2013.01); *H01L 21/67069* (2013.01)

(58) Field of Classification Search
  None
  See application file for complete search history.

(56) References Cited

U.S. PATENT DOCUMENTS

2002/0149317 A1* 10/2002 Nakano ............. H01J 37/32082
                                                      315/111.11
2003/0159715 A1*  8/2003 Scanlan ............. H01J 37/32862
                                                            134/18

FOREIGN PATENT DOCUMENTS

| CN | 104716033 A | 6/2015 |
|---|---|---|
| CN | 106298604 A | 1/2017 |
| CN | 107958838 A | 4/2018 |
| CN | 109962001 A | 7/2019 |
| CN | 110416111 A | 11/2019 |
| CN | 107958838 B | 8/2020 |

(Continued)

OTHER PUBLICATIONS

International Search Report and English Translation cited in PCT/CN2021/113178 dated Apr. 25, 2022, 11 pages.

(Continued)

*Primary Examiner* — Roberts P Culbert
(74) *Attorney, Agent, or Firm* — Cooper Legal Group, LLC

(57) ABSTRACT

Embodiments of the present disclosure provide a method and a device for determining a fabrication chamber. According to a current radio frequency power time of each of the fabrication chambers corresponding to adjacent process steps and service phases divided based on a service period of the fabrication chambers, a service phase is determined for the current radio frequency power time of each of the fabrication chambers. For target objects processed by the fabrication chambers in the current process step, fabrication chambers for the target objects to enter in a next process step are directly determined according to the service phase of the current radio frequency power time of each of the fabrication chambers.

15 Claims, 8 Drawing Sheets

(56) References Cited

FOREIGN PATENT DOCUMENTS

| | | |
|---|---|---|
| CN | 111968905 A | 11/2020 |
| CN | 113073312 A | 7/2021 |
| JP | 2010087361 A | 4/2010 |

OTHER PUBLICATIONS

Written Opinion and English Translation cited in PCT/CN2021/113178 dated Apr. 25, 2022, 8 pages.

* cited by examiner

METHOD AND DEVICE FOR DETERMINING FABRICATION CHAMBER

CROSS-REFERENCE TO RELATED APPLICATIONS

This is a continuation of International Application No. PCT/CN2021/113178, filed on Aug. 18, 2021, which claims the priority to Chinese Patent Application 202110925197.X, titled "METHOD AND DEVICE FOR DETERMINING FABRICATION CHAMBER" and filed with the China National Intellectual Property Administration (CNIPA) on Aug. 12, 2021. The entire contents of International Application No. PCT/CN2021/113178 and Chinese Patent Application 202110925197.X are incorporated herein by reference.

TECHNICAL FIELD

The present disclosure relates to the technical field of semiconductors, in particular to a method and a device for determining a fabrication chamber.

BACKGROUND

With the continuous development of semiconductor technology and storage technology, electronic devices continue to develop towards miniaturization and integration. A dynamic random access memory (DRAM) is widely used in various electronic devices due to its high storage density and fast reading and writing speed. The DRAM is generally composed of multiple memory cells. Each memory cell typically includes a transistor structure and a capacitor. The capacitor stores data information, and the transistor structure controls the reading and writing of data information in the capacitor.

Generally, the fabrication of a semiconductor device requires multiple process steps, and different process steps require different fabrication chambers. At present, the matching mode of the fabrication chambers required for different process steps is usually manually determined, which is labor-consuming.

SUMMARY

According to some embodiments, a first aspect of the present disclosure provides a method for determining a fabrication chamber, including:

obtaining a current radio frequency power time of each fabrication chamber in a current process step, and obtaining a current radio frequency power time of each fabrication chamber to be selected for a next process step;

determining a service phase for the current radio frequency power time of each of the fabrication chambers in the current process step and a service phase for the current radio frequency power time of each of the fabrication chambers to be selected according to the current radio frequency power time of each of the fabrication chambers in the current process step, the current radio frequency power time of each of the fabrication chambers to be selected and multiple consecutive service phases set, wherein the multiple consecutive service phases are divided based on a service period of each of the fabrication chambers, and the service period of each of the fabrication chambers is from an end of a current cleaning to a beginning of a next cleaning; and determining fabrication chambers for target objects to enter in the next process step from the fabrication chambers to be selected according to the service phase of the current radio frequency power time of each of the fabrication chambers in the current process step and the service phase of the current radio frequency power time of each of the fabrication chambers to be selected, wherein the target objects are objects processed by the fabrication chambers in the current process step.

Some embodiments of the present disclosure provide a device for determining a fabrication chamber, including:

an obtaining unit, configured to obtain a current radio frequency power time of each fabrication chamber in a current process step, and obtain a current radio frequency power time of each fabrication chamber to be selected for a next process step;

a phase determination unit, configured to determine a service phase for the current radio frequency power time of each of the fabrication chambers in the current process step and a service phase for the current radio frequency power time of each of the fabrication chambers to be selected according to the current radio frequency power time of each of the fabrication chambers in the current process step, the current radio frequency power time of each of the fabrication chambers to be selected and multiple consecutive service phases set, wherein the multiple consecutive service phases are divided based on a service period of each of the fabrication chambers, and the service period of each of the fabrication chambers is from an end of a current cleaning to a beginning of a next cleaning; and a chamber determination unit, configured to determine fabrication chambers for target objects to enter in the next process step from the fabrication chambers to be selected according to the service phase of the current radio frequency power time of each of the fabrication chambers in the current process step and the service phase of the current radio frequency power time of each of the fabrication chambers to be selected, wherein the target objects are objects processed by the fabrication chambers in the current process step.

DETAILED DESCRIPTION

Figure 1:
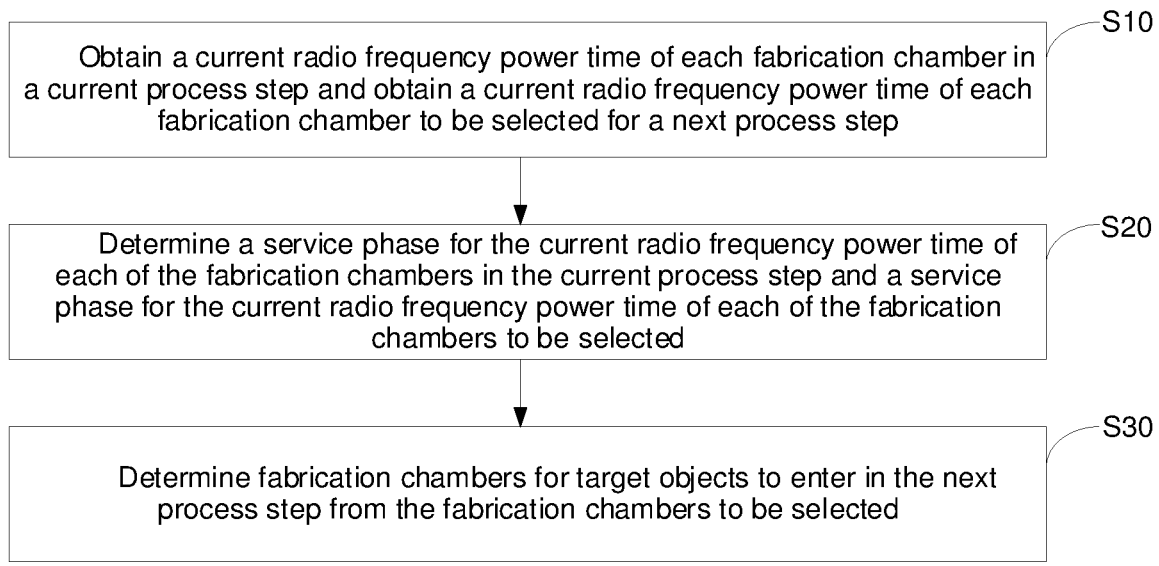
FIG. 1 is a flowchart of a method for determining a fabrication chamber according to an embodiment of the present disclosure.

In order to make the objectives, technical solutions and advantages of the embodiments of the present disclosure clearer, the technical solutions in the embodiments of the present disclosure are clearly and completely described below with reference to the drawings in the embodiments of the present disclosure. Apparently, the described embodiments are part rather than all of the embodiments of the present disclosure. The embodiments in the present disclosure and features in the embodiments may be combined with each other in a non-conflicting manner. All other embodiments obtained by those of ordinary skill in the art based on the described embodiments of the present disclosure without creative efforts should fall within the protection scope of the present disclosure.

Unless otherwise defined, the technical or scientific terms used herein should have the usual meanings understood by those of ordinary skill in the field to which the present disclosure belongs. Terms such as "first" and "second" used herein do not denote any order, quantity or importance, but are merely intended to distinguish between different constituents. Terms such as "include" or "comprise" means that the element or item appearing before the term encompass the elements or items listed after the term and their equivalents, without excluding other elements or items. Terms such as "connected to" and "connected with" are not restricted to physical or mechanical connections, but may also include electrical connections, whether direct or indirect.

It should be noted that the size and shape of each figure in the drawings do not reflect the true ratio, but are intended to illustrate the present disclosure. The same or similar reference numerals in the specification represent the same or similar elements or those having the same or similar functions.

Generally, the fabrication of a semiconductor device requires multiple process steps, and different process steps require different fabrication chambers. For example, in actual applications, to fabricate transistors or capacitors of the semiconductor device, each process step may process a large number of objects, such as wafers. In order to improve production efficiency, multiple fabrication chambers may be applied to the same process step, so as to distribute a large number of wafers into different fabrication chambers for processing in the same process step.

In practical applications, for example, the inner wall of the fabrication chamber (including the surface of the slide table) will accumulate a deposit. The deposit is thickening as the continuous service time or service frequency of the fabrication chamber increases. When the accumulated deposit reaches a certain thickness, it will fall off and produce fine dust particles under the influence of external force or its own gravity. These dust particles may fall on the surface of the wafer to cause the device to fail. For this reason, during the production process, it is often necessary to clean the inner wall and other parts of the fabrication chamber in the production equipment, so as to remove the accumulated deposit and prevent wafer contamination due to the shedding of the deposit. However, high-frequency cleaning of the fabrication chamber will result in reduced productivity and shortened equipment life.

In view of this, an embodiment of the present disclosure provides a method for determining a fabrication chamber. According to a current radio frequency (RF) power time of each fabrication chamber corresponding to adjacent process steps and service phases divided based on a service period of the fabrication chambers, a service phase is determined for the current RF power time of each of the fabrication chambers. For target objects processed by the fabrication chambers in the current process step, fabrication chambers for the target objects to enter in a next process step are directly determined according to the service phase of the current RF power time of each of the fabrication chambers. The target objects are directly controlled to enter the determined fabrication chambers to perform a fabrication process of the next process step. In this way, the present disclosure saves manpower and improves the degree of automation.

FIG. 1 is a flowchart of a method for determining a fabrication chamber according to an embodiment of the present disclosure. Referring to FIG. 1, the method for determining a fabrication chamber provided by the embodiment of the present disclosure may include the following steps:

S10: Obtain a current RF power time of each fabrication chamber in a current process step, and obtain a current RF power time of each fabrication chamber to be selected for a next process step.

In the embodiment of the present disclosure, a total service time of the fabrication chamber that performs a corresponding process step from the end of a current cleaning to the beginning of a next cleaning is defined as a service period. In other words, the fabrication chamber needs to be cleaned after working for a service period so as to ensure that the fabrication chamber is clean. After a cleaning is completed, when a wafer needs to be processed, the wafer is sent into a corresponding fabrication chamber according to a process step required for the process, and the fabrication chamber performs the operation of the corresponding process step until a next cleaning starts. A real-time service time of the fabrication chamber to perform a corresponding process step from the end of a cleaning to the beginning of a next cleaning, that is, during a service period, is defined as an RF power time. For example, if the RF power time of a fabrication chamber with a 24 h service period is 5 h, it means that in the 24 h service period, the fabrication chamber has been in service for 5 h and it needs to be cleaned after it continues to serve for 19 h. It should be noted that if the fabrication chamber is idle, the idle time is not included in the service period or the RF power time.

Figure 2A:
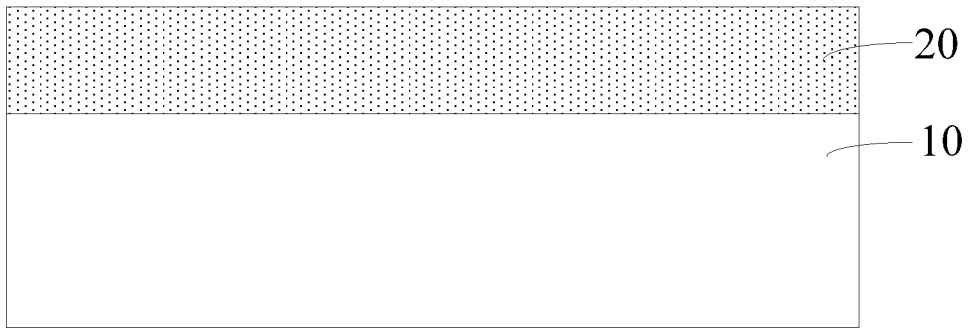
FIG. 2A is a schematic structural diagram of fabricating capacitors according to an embodiment of the present disclosure.
Figure 2B:
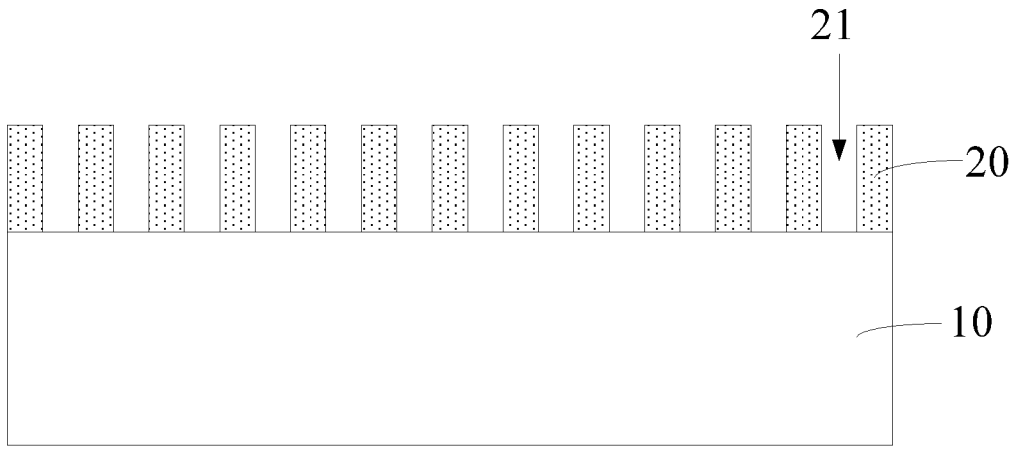
FIG. 2B is another schematic structural diagram of fabricating capacitors according to an embodiment of the present disclosure.
Figure 2C:
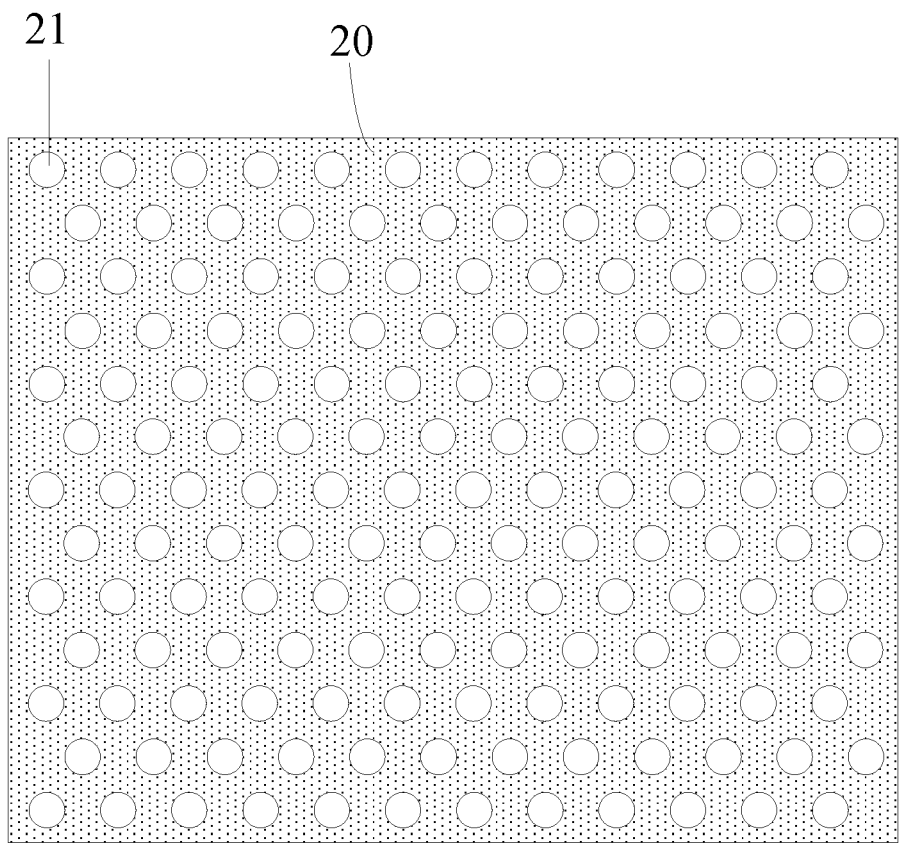
FIG. 2C is yet another schematic structural diagram of fabricating capacitors according to an embodiment of the present disclosure.
Figure 2D:
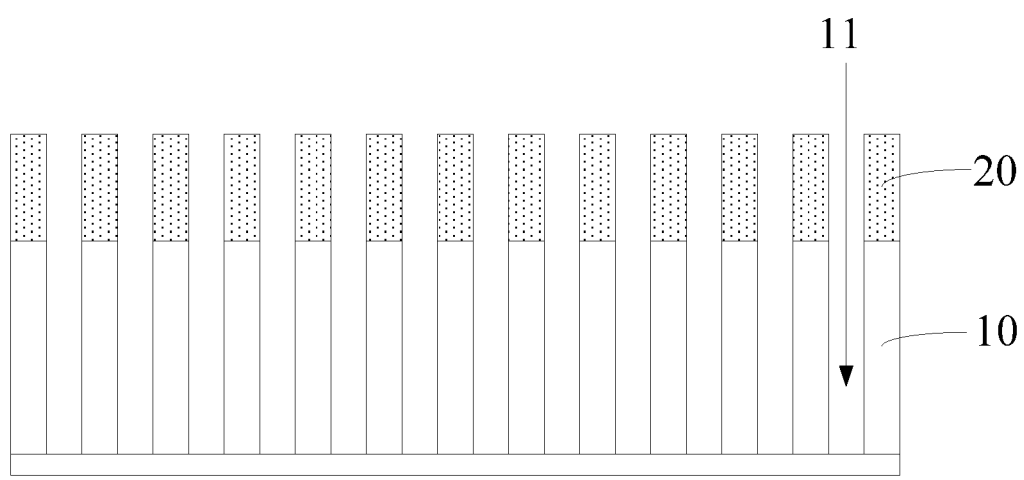
FIG. 2D is yet another schematic structural diagram of fabricating capacitors according to an embodiment of the present disclosure.

FIG. 2A is a schematic structural diagram of fabricating capacitors according to an embodiment of the present disclosure. FIG. 2B is another schematic structural diagram of fabricating capacitors according to an embodiment of the present disclosure. FIG. 2C is yet another schematic structural diagram of fabricating capacitors according to an embodiment of the present disclosure. FIG. 2D is yet another schematic structural diagram of fabricating capacitors according to an embodiment of the present disclosure. Referring to FIGS. 2A to 2D, a fabrication process of capacitors may include: form a support layer 10, form a mask layer 20 on the support layer, etch the mask layer 20 to form multiple spaced mask holes 21 in the mask layer 20 so as to form an etch mask, etch the support layer 10 based on a pattern of the mask layer 20 to form multiple spaced capacitor holes 11 in the support layer 10, and form a first electrode layer, a dielectric layer and a second electrode layer on inner walls of the capacitor holes after the capacitor holes 11 are formed, thereby forming the capacitors.

In the embodiment of the present disclosure, a current process step may be, for example, the mask etching process step in the fabrication process of the capacitor holes. That is, through the current process step, the mask layer may be etched to form the mask holes during the fabrication process of the capacitor. Exemplarily, the mask layer may be made of a semiconductor material (Poly) so as to form the mask holes through a semiconductor etching process. In this way, the current process step may be a semiconductor etching process step. Of course, in practical applications, the current process step may also be a deposition process step for forming each film layer, or an etching process step or a deposition process step in a fabrication process of a transistor, which is not limited herein.

In the embodiment of the present disclosure, a next process step may be, for example, the support layer etching process step in the fabrication process of the capacitor holes. That is, through the next process step, the support layer may be etched to form the capacitor holes during the fabrication process of the capacitor. Exemplarily, the multiple spaced capacitor holes may be formed in the support layer through a high aspect ratio contact (HARC) etching process. In this way, the next process step may be an HARC etching process step. Of course, in practical applications, the next process step may also be a deposition process step for forming each film layer, or an etching process step or a deposition process step in a fabrication process of a transistor, which is not limited herein.

In the following description, the current process step is a mask etching process step in a fabrication process of capacitor holes, and the next process step is a support layer etching process step in the fabrication process of the capacitor holes.

In the embodiment of the present disclosure, the S10: obtain a current RF power time of each fabrication chamber in a current process step may specifically include: obtain a current RF power time of each of the fabrication chambers in a current etching step when an etching process is completed in the fabrication chambers corresponding to the current etching step. Exemplarily, during a fabrication process of a capacitor, a mask hole fabrication chamber is used to etch a mask layer to form mask holes. After the mask holes are formed, a service time of the mask hole fabrication chamber for this etching is determined, and the determined time is updated to the latest RF power time of a service period. The latest RF power time may be extracted from the mask hole fabrication chamber as the current RF power time. The mask hole fabrication chamber may also report its latest RF power time in real time. Thus, the current RF power time corresponding to the fabrication chamber of the current etching step maybe obtained.

In the embodiment of the present disclosure, the S10: obtain a current RF power time of each fabrication chamber to be selected for a next process step may specifically include: obtain a current RF power time of each of the fabrication chambers to be selected for a next etching step before the fabrication chambers corresponding to the next etching step start the etching process.

Exemplarily, during the fabrication process of the capacitor, an HARC fabrication chamber is used to etch a support layer. After capacitor holes are formed, a service time of the HARC fabrication chamber for this etching is determined, and the determined time is updated to the latest RF power time of the service period. The latest RF power time may be extracted from the HARC fabrication chamber as the current RF power time. The HARC fabrication chamber may also report its latest RF power time in real time. Thus, the current RF power time corresponding to the fabrication chamber of the next etching step may be obtained.

S20: Determine a service phase for the current RF power time of each of the fabrication chambers in the current process step and a service phase for the current RF power time of each of the fabrication chambers to be selected according to the current RF power time of each of the fabrication chambers in the current process step, the current RF power time of each of the fabrication chambers to be selected and multiple consecutive service phases set.

In the embodiment of the present disclosure, the service period of each fabrication chamber may be divided into multiple consecutive service phases, for example, a service phase 1 to a service phase N appearing in sequence. In some examples, the number of service phases corresponding to each fabrication chamber may be the same. In the embodiment of the present disclosure, the service period of each mask hole fabrication chamber may be divided into a service phase 1 to a service phase N appearing in sequence. The service period of the HARC fabrication chamber may also be divided into a service phase 1 to a service phase N appearing in sequence. For example, the service period of each mask hole fabrication chamber may be divided into service phases 1 to 3 that appear in sequence. The service period of the HARC fabrication chamber may also be divided into service phases 1 to 3 that appear in sequence. Of course, in practical applications, the number of the service phases of the service period of the mask hole fabrication chamber may be greater than that of the service phases of the service period of the HARC fabrication chamber. Alternatively, the number of the service phases of the service period of the mask hole fabrication chamber may be less than that of the service phases of the service period of the HARC fabrication chamber. These two cases are not limited here.

It should be noted that N may be 2, 3, 4, 5 or a greater number, which may be determined according to actual applications and is not limited here.

In the embodiment of the present disclosure, the duration of the multiple consecutive service phases may be the same. Exemplarily, the duration of the service phase 1 to the service phase N is the same. Taking N=3 as an example, the duration of a service phase 1, the duration of a service phase 2 and the duration of a service phase 3 are 8 h respectively.

In the embodiment of the present disclosure, among the multiple consecutive service phases, the duration of a previous service phase may be greater than that of a latter service phase. Exemplarily, the duration of a service phase 1 is greater than that of a service phase 2, the duration of the service phase 2 is greater than that of a service phase 3, the duration of the service phase 3 is greater than that of a service phase 4, and the duration of a service phase N−1 is greater than that of a service phase N. For example, taking N=3 as an example, the duration of a service phase 1 is 10 h, the duration of a service phase 2 is 9 h, and the duration of a service phase 3 is 8 h.

In the embodiment of the present disclosure, among the multiple consecutive service phases, the duration of an intermediate service phase may be greater than that of a service phase at either end. Taking $1<y<N$ as an example, the duration of a service phase y may be greater than that of a service phase 1, and the duration of the service phase y may be greater than that of a service phase N. Taking N=3 as an example, the duration of a service phase 2 is greater than that of a service phase 1, and the duration of the service phase 2 is greater than that of a service phase 3. Taking N=3 as an example, the duration of a service phase 1 is 8 h, the duration of a service phase 2 is 10 h, and the duration of a service phase 3 is 7 h.

In the embodiment of the present disclosure, for each fabrication chamber corresponding to the current process step, the same sequential service phase corresponding to each fabrication chamber has the same range. Exemplarily, each mask hole fabrication chamber corresponds to the service phase 1 to the service phase N. The range of a service phase 1 corresponding to each mask hole fabrication chamber is the same, the range of a service phase 2 corresponding to each mask hole fabrication chamber is the same, the range of a service phase 3 corresponding to each mask hole fabrication chamber is the same, and the range of a service phase N corresponding to each mask hole fabrication chamber is the same. For example, if N=3 and the service period of the mask hole fabrication chamber is 24 h, the range of a service phase 1 (D11) corresponding to each mask hole fabrication chamber may be 0 h<$D11$≤8 h, the range of a service phase 2 (D12) corresponding to each mask hole fabrication chamber may be 8 h<$D12$≤16 h, and the range of a service phase 3 (D13) corresponding to each mask hole fabrication chamber may be 16 h<$D13$≤24 h.

In the embodiment of the present disclosure, for each fabrication chamber corresponding to the next process step, the same sequential service phase corresponding to each fabrication chamber has the same range. Exemplarily, each HARC fabrication chamber corresponds to the service phase 1 to the service phase N. The range of a service phase 1 corresponding to each HARC fabrication chamber is the same, the range of a service phase 2 corresponding to each HARC fabrication chamber is the same, the range of a service phase 3 corresponding to each HARC fabrication chamber is the same, and the range of a service phase N corresponding to each HARC fabrication chamber is the same. For example, if N=3 and the service period of the HARC fabrication chamber is 24 h, the range of a service phase 1 (D21) corresponding to each HARC fabrication chamber may be 0 h<$D21$≤8 h, the range of a service phase 2 (D22) corresponding to each HARC fabrication chamber may be 8 h<$D22$≤16 h, and the range of a service phase 3 (D23) corresponding to each HARC fabrication chamber may be 16 h<$D23$≤24 h.

In the embodiment of the present disclosure, the same sequential service phase corresponding to all fabrication chambers has the same range. Exemplarily, each mask hole fabrication chamber corresponds to the service phase 1 to the service phase N, and each HARC fabrication chamber corresponds to the service phase 1 to the service phase N. For example, if N=3, the service period of all mask hole fabrication chambers is 24 h and the service period of all HARC fabrication chambers is 24 h, the range of a service phase 1 (D11) corresponding to each mask hole fabrication chamber may be 0 h<$D11$≤8 h, and the range of a service phase 1 (D21) corresponding to each HARC fabrication chamber may be 0 h<$D21$≤8 h. The range of a service phase 2 (D12) corresponding to each mask hole fabrication chamber may be 8 h<$D12$≤16 h, and the range of a service phase 2 (D22) corresponding to each HARC fabrication chamber may be 8 h<$D22$≤16 h. The range of a service phase 3 (D13) corresponding to each mask hole fabrication chamber may be 16 h<$D13$≤24 h, and the range of a service phase 3 (D23) corresponding to each HARC fabrication chamber may be 16 h<$D23$≤24 h.

S30: Determine fabrication chambers for target objects to enter in the next process step from fabrication chambers to be selected according to the service phase of the current RF power time of each of the fabrication chambers in the current process step and the service phase of the current RF power time of each of the fabrication chambers to be selected.

In the embodiment of the present disclosure, after the fabrication chambers complete the fabrication process of the current process step, the objects processed in the fabrication chambers are taken out for the fabrication process of the next process step. That is, after determining the service phase for the current RF power time of each of the fabrication chambers in the current process step, and before determining the fabrication chambers for the target objects to enter in the next process step from combinations, the method further includes: add an identification tag to the target objects processed by the fabrication chambers in the current process step, where the identification tag carries information of the corresponding service phase of the fabrication chambers where the target objects are processed. Exemplarily, the target objects may be objects that have been processed in the fabrication chambers corresponding to the current process step. The target objects are taken out of the fabrication chambers, and are provided with a corresponding identification tag. The identification tag carries information of a corresponding service phase of the fabrication chambers where the target objects are processed. For example, the mask hole fabrication chambers include: a fabrication chamber A11, a fabrication chamber A12, a fabrication chamber A13, a fabrication chamber A14, a fabrication chamber A15, a fabrication chamber A16, a fabrication chamber A17 and a fabrication chamber A18. Target objects T1 processed by the fabrication chamber A11 carries an identification tag of a corresponding service phase of the fabrication chamber A11. Target objects T2 processed by the fabrication chamber A12 carries an identification tag of a corresponding service phase of the fabrication chamber A12. Target objects T3 processed by the fabrication chamber A13 carries an identification tag of a corresponding service phase of the fabrication chamber A13. Target objects T4 processed by the fabrication chamber A14 carries an identification tag of a corresponding service phase of the fabrication chamber A14. Target objects T5 processed by the fabrication chamber A15 carries an identification tag of a corresponding service phase of the fabrication chamber A15. Target objects T6 processed by the fabrication chamber A16 carries an identification tag of a corresponding service phase of the fabrication chamber A16. Target objects T7 processed by the fabrication chamber A17 carries an identification tag of a corresponding service phase of the fabrication chamber A17. Target objects T8 processed by the fabrication chamber A18 carries an identification tag of a corresponding service phase of the fabrication chamber A18.

Exemplarily, the target objects may be wafers. For example, the target objects may be wafers with mask holes formed through a mask etching process step. Of course, the target objects may also be other suitable objects, which is not limited here.

In the embodiment of the present disclosure, by defining the service phases of the fabrication chambers, according to the service phase of the current RF power time of each of the fabrication chambers, the fabrication chambers that have served for different periods of time are screened out and divided. In this way, according to the service phase of the current RF power time of each of the fabrication chambers, the fabrication chambers for the target objects to enter in the next process step are determined. In this way, the target objects can be controlled to enter the determined fabrication chambers to go through the fabrication process of the next process step. In this way, the present disclosure saves manpower and improves the degree of automation.

Exemplarily, in the fabrication process of a semiconductor device, during a period from a cleaning of the fabrication chamber to a next cleaning of the fabrication chamber, as the fabrication chamber is used, there may be more and more impurities produced in the chamber. If the wafer enters a mask hole fabrication chamber with a shorter RF power time for processing and then enters an HARC fabrication chamber with a shorter RF power time for processing, the probability of a wafer defect is smaller. If the wafer enters a mask hole fabrication chamber with a longer RF power time for processing and then enters an HARC fabrication chamber with a longer RF power time for processing, the probability of a wafer defect is greater. If the wafer only enters a mask hole fabrication chamber with a shorter RF power time for processing and then enters an HARC fabrication chamber with a shorter RF power time for processing, an HARC fabrication chamber with a longer RF power time will be idle. If the wafer only enters a mask hole fabrication chamber with a longer RF power time for processing and then enters an HARC fabrication chamber with a longer RF power time for processing, the probability of a wafer defect is increased.

Figure 3:
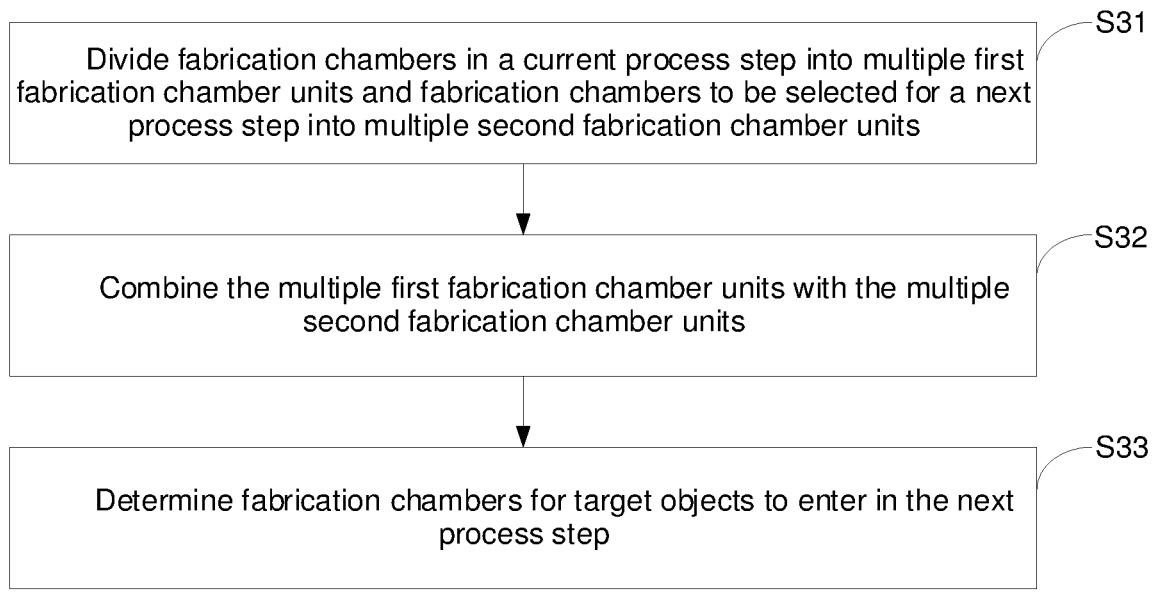
FIG. 3 is another flowchart of the method for determining a fabrication chamber according to an embodiment of the present disclosure.

FIG. 3 is another flowchart of the method for determining a fabrication chamber according to an embodiment of the present disclosure. In the embodiment of the present disclosure, referring to FIG. 3, the S30: determine fabrication chambers for the target objects to enter in the next process step from fabrication chambers to be selected may specifically include:

S31: Divide the fabrication chambers in the current process step into multiple first fabrication chamber units and the fabrication chambers to be selected for the next process step into multiple second fabrication chamber units, according to the service phase of the current RF power time of each of the fabrication chambers.

In some examples, the multiple first fabrication chamber units correspond to the service phases one to one. For example, if N=3, the fabrication chambers corresponding to the current process step are mask hole fabrication chambers and the service period of the mask hole fabrication chambers is 24 h, the range of the service phase 1 (D11) may be 0 h<D11≤8 h, the range of the service phase 2 (D12) may be 8 h<D12≤16 h, and the range of the service phase 3 (D13) may be 16 h<D13≤24 h. For example, the mask hole fabrication chambers include: a fabrication chamber A11, a fabrication chamber A12, a fabrication chamber A13, a fabrication chamber A14, a fabrication chamber A15, a fabrication chamber A16, a fabrication chamber A17 and a fabrication chamber A18. The current RF power time of the fabrication chamber A11 is 5 h, the current RF power time of the fabrication chamber A12 is 17 h, the current RF power time of the fabrication chamber A13 is 9 h, the current RF power time of the fabrication chamber A14 is 10 h, the current RF power time of the fabrication chamber A15 is 6 h, the current RF power time of the fabrication chamber A16 is 20 h, the current RF power time of the fabrication chamber A17 is 4 h, and the current RF power time of the fabrication chamber A18 is 13 h.

Figure 4:
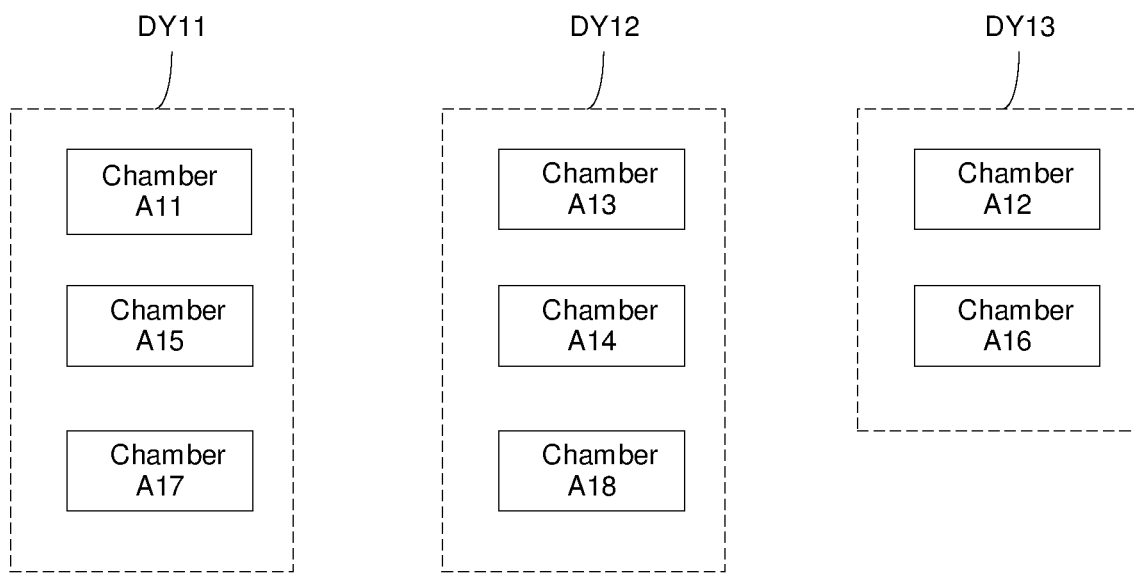
FIG. 4 is a schematic diagram of first fabrication chamber units according to an embodiment of the present disclosure.

Therefore, referring to FIG. 4, the fabrication chambers A11, A15 and A17 are in the service phase 1, so the fabrication chambers A11, A15 and A17 are included in a first fabrication chamber unit DY11 corresponding to the service phase 1. FIG. 4 is a schematic diagram of first fabrication chamber units according to an embodiment of the present disclosure.

Referring to FIG. 4, the fabrication chambers A13, A14 and A18 are in the service phase 2, so the fabrication chambers A13, A14 and A18 are included in a first fabrication chamber unit DY12 corresponding to the service phase 2.

Referring to FIG. 4, the fabrication chambers A12 and A16 are in the service phase 3, so the fabrication chambers A12 and A16 are included in a first fabrication chamber unit DY13 corresponding to the service phase 3.

In some examples, the multiple second fabrication chamber units correspond to the service phases one to one. For example, if the N=3, the fabrication chambers corresponding to the next process step are HARC fabrication chambers and the service period of the mask hole fabrication chamber is 24 h, the range of the service phase 1 (D21) may be 0 h<D21≤8 h, the range of the service phase 2 (D22) may be 8 h<D22≤16 h, and the range of the service phase 3 (D23) may be 16 h<D23≤24 h. For example, the HARC fabrication chambers include: a fabrication chamber A21, a fabrication chamber A22, a fabrication chamber A23, a fabrication chamber A24, a fabrication chamber A25, a fabrication chamber A26, a fabrication chamber A27 and a fabrication chamber A28. The current RF power time of the fabrication chamber A21 is 3 h, the current RF power time of the fabrication chamber A22 is 12 h, the current RF power time of the fabrication chamber A23 is 23 h, the current RF power time of the fabrication chamber A24 is 4 h, the current RF power time of the fabrication chamber A25 is 18 h, the current RF power time of the fabrication chamber A26 is 7 h, the current RF power time of the fabrication chamber A27 is 16 h, and the current RF power time of the fabrication chamber A28 is 10 h.

Figure 5:
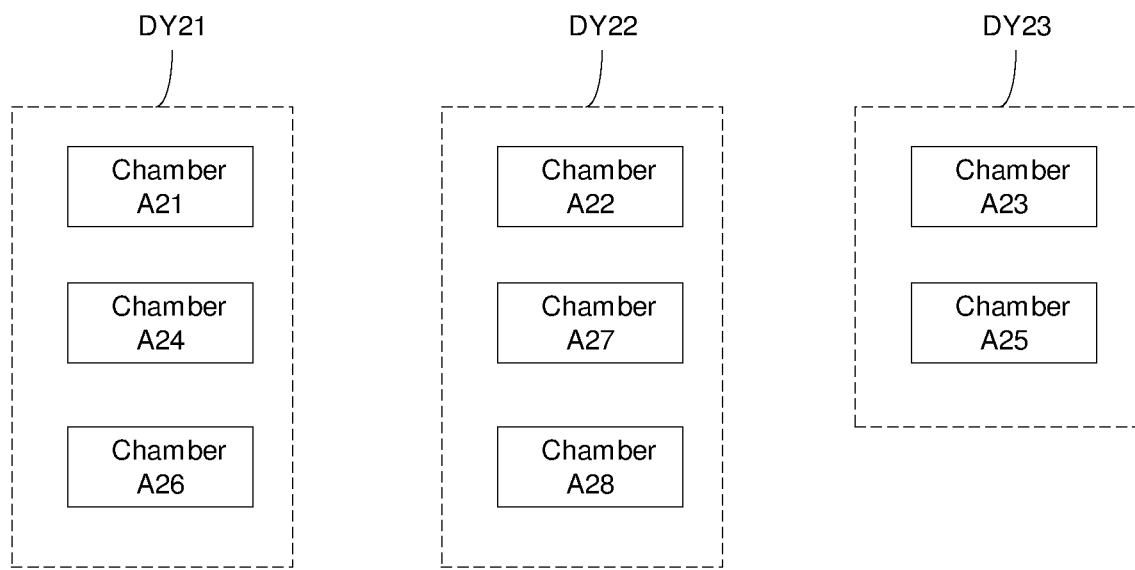
FIG. 5 is a schematic diagram of second fabrication chamber units according to an embodiment of the present disclosure.

Therefore, referring to FIG. 5, the fabrication chambers A21, A24 and A26 are in the service phase 1, so the fabrication chambers A21, A24 and A26 are included in a second fabrication chamber unit DY21 corresponding to the service phase 1. FIG. 5 is a schematic diagram of second fabrication chamber units according to an embodiment of the present disclosure.

Referring to FIG. 5, the fabrication chambers A22, A27 and A28 are in the service phase 2, so the fabrication chambers A22, A27 and A28 are included in a second fabrication chamber unit DY22 corresponding to the service phase 2.

Referring to FIG. 5, the fabrication chambers A23 and A25 are in the service phase 3, so the fabrication chambers A23 and A25 are included in a second fabrication chamber unit DY23 corresponding to the service phase 3.

S32: Combine the multiple first fabrication chamber units with the multiple second fabrication chamber units.

In the embodiment of the present disclosure, the first fabrication chamber unit corresponding to the service phase 1 may be combined with the second fabrication chamber unit corresponding to a service phase other than the service phase 1. Taking N=3 as an example, the first fabrication chamber unit DY11 corresponding to the service phase 1 may be combined with the second fabrication chamber unit DY22 corresponding to the service phase 2, and the first fabrication chamber unit DY11 corresponding to the service phase 1 may also be combined with the second fabrication chamber unit DY23 corresponding to the service phase 3. The remaining first fabrication chamber units DY12 and DY13 may be combined arbitrarily with the second fabrication chamber units DY21 to DY23.

In the embodiment of the present disclosure, the first fabrication chamber unit corresponding to the service phase 1 may be combined with at least one of second fabrication chamber units corresponding to a service phase 2 to the service phase N. Taking N=3 as an example, the first fabrication chamber unit DY11 corresponding to the service phase 1 may only be combined with the second fabrication chamber unit DY22 corresponding to the service phase 2. Alternatively, the first fabrication chamber unit DY11 corresponding to the service phase 1 may only be combined with the second fabrication chamber unit DY23 corresponding to the service phase 3. Alternatively, the first fabrication chamber unit DY11 corresponding to the service phase 1 may be combined with the second fabrication chamber unit DY22 corresponding to the service phase 2, and the first fabrication chamber unit DY11 corresponding to the service phase 1 may also be combined with the second fabrication chamber unit DY23 corresponding to the service phase 3.

In the embodiment of the present disclosure, each first fabrication chamber unit corresponding to the service phase 2 to the service phase N may be combined with at least one of second fabrication chamber units corresponding to the service phase 1 to the service phase N. The at least one second fabrication chamber unit combined with the first fabrication chamber unit corresponding to the service phase 1 is different from the at least one second fabrication chamber units combined with each of the first fabrication chamber units corresponding to the service phase 2 to the service phase N. Taking N=3 as an example, if the first fabrication chamber unit DY11 corresponding to the service phase 1 is combined with the second fabrication chamber unit DY22 corresponding to the service phase 2, the first fabrication chamber unit DY12 corresponding to the service phase 2 may be combined with the second fabrication chamber unit DY21 corresponding to the service phase 1. The first fabrication chamber unit DY13 corresponding to the service phase 3 may be combined with the second fabrication chamber unit DY21 corresponding to the service phase 1. Alternatively, if the first fabrication chamber unit DY11 corresponding to the service phase 1 is only combined with the second fabrication chamber unit DY22 corresponding to the service phase 2, the first fabrication chamber unit DY12 corresponding to the service phase 2 may be combined with the second fabrication chamber unit DY23 corresponding to the service phase 3. The first fabrication chamber unit DY13 corresponding to the service phase 3 may be combined with the second fabrication chamber unit DY21 corresponding to the service phase 1.

S33: Determine fabrication chambers for the target objects to enter in the next process step from combinations based on the target objects, and then send the target objects into the fabrication chambers corresponding to the next process step.

In the embodiment of the present disclosure, the target objects are provided with an identification tag offering information of the corresponding service phase of the fabrication chambers where the target objects are processed. In this way, based on the identification tag carried by the target objects, the fabrication chambers for the target objects to enter in the next process step can be determined from the combinations. Exemplarily, the target object T1 carries an identification tag indicating the corresponding service phase of the fabrication chamber A11. According to the identification tag, the combination of the fabrication chamber A11 can be determined, and the corresponding fabrication chambers for the target object T1 to enter in the next process step can be determined according to the combination. Exemplarily, the target object T2 carries an identification tag indicating the corresponding service phase of the fabrication chamber A12. According to the identification tag, the combination of the fabrication chamber A12 can be determined, and the corresponding fabrication chamber for the next process step of the target object T2 can be determined according to the combination. The rest are the same and will not be repeated here.

The determination of the fabrication chambers for the target objects to enter in the next process step from the combinations based on the identification tag carried by the target objects is described below with reference to a specific example. It should be noted that the following embodiment is intended to better explain the present disclosure, rather than to limit the present disclosure.

In an embodiment of the present disclosure, a combination of a first fabrication chamber unit corresponding to a service phase 1 and a second fabrication chamber unit corresponding to a service phase 2 may be taken as a first combination. In this way, based on the information of the service phase 1 carried by the target objects, the first combination can be selected from the combinations, and it is determined that the target objects carrying the information of the service phase 1 are corresponding to the second fabrication chamber unit corresponding to the service phase 2.

A combination of a first fabrication chamber unit corresponding to a service phase k and a second fabrication chamber unit corresponding to a service phase k+1 may be taken as a second combination, where k is an integer, and 1<k<N. In this way, based on the information of the service phase k carried by the target objects, the second combination can be selected from the combinations, and it is determined that the target objects carrying the information of the service phase k are corresponding to the second fabrication chamber unit corresponding to the service phase k+1.

A combination of a first fabrication chamber unit corresponding to a service phase N and a second fabrication chamber unit corresponding to the service phase 1 may be taken as a third combination. In this way, based on the information of the service phase N carried by the target objects, the third combination can be selected from the combinations, and it is determined that the target objects carrying the information of the service phase N are corresponding to the second fabrication chamber unit corresponding to the service phase 1.

Figure 6:
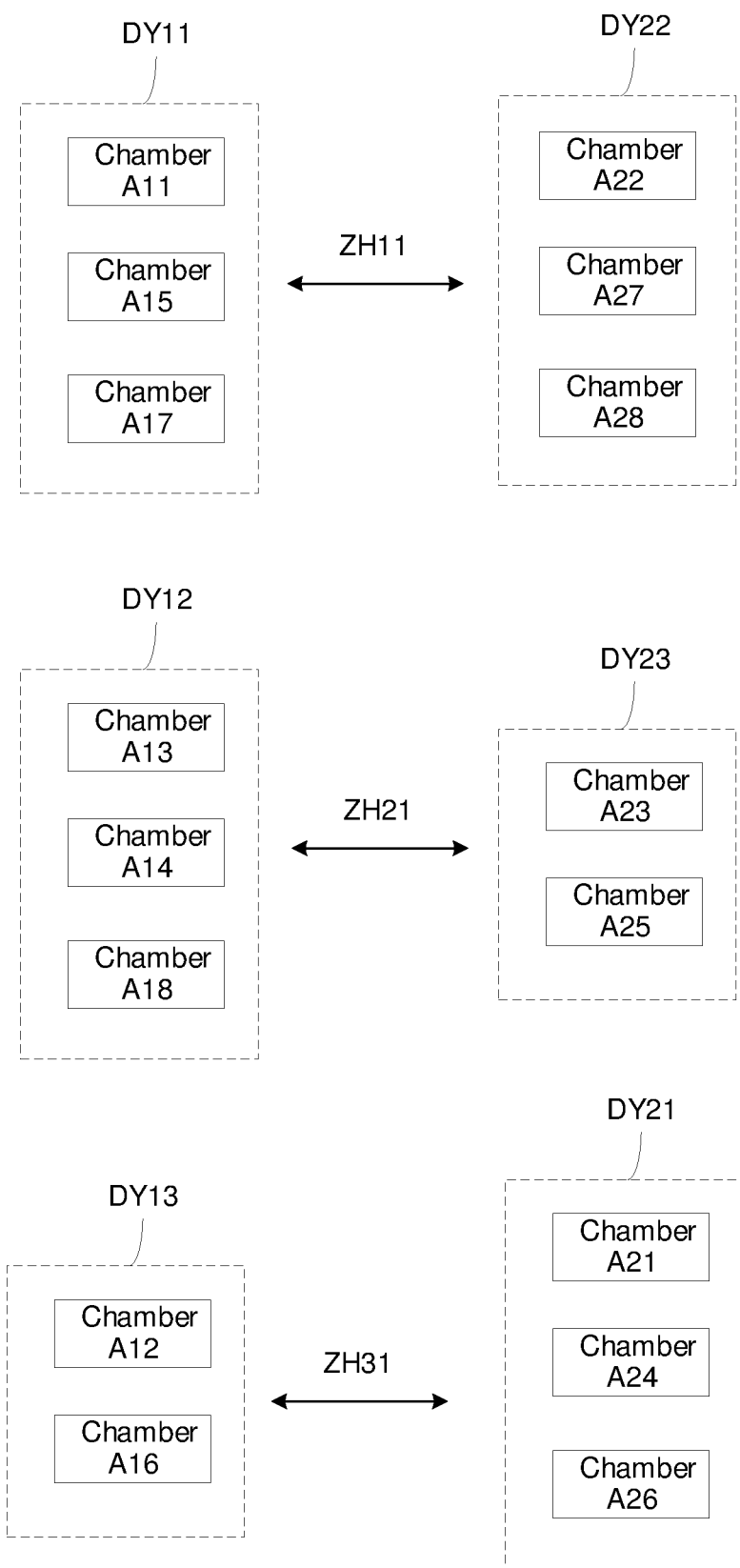
FIG. 6 is a schematic diagram of a first combination, a second combination and a third combination according to an embodiment of the present disclosure.

FIG. 6 is a schematic diagram of a first combination, a second combination and a third combination according to an embodiment of the present disclosure.

Exemplarily, referring to FIG. 6, taking N=3 as an example, the fabrication chambers A11, A15 and A17 in the first fabrication chamber unit DY11 corresponding to the service phase 1 and the fabrication chambers A22, A27 and A28 in the second fabrication chamber unit DY22 corresponding to the service phase 2 may define a first combination ZH11. In this way, based on the information of the service phase 1 carried by the target objects T1, the first combination ZH11 corresponding to the first fabrication chamber unit DY11 can be selected from the combinations. Then, according to the first combination ZH11, the fabrication chambers A22, A27 and A28 in the second fabrication chamber unit DY22 corresponding to the service phase 2 are determined as the fabrication chambers corresponding to the target objects T1. In this way, the target objects T1 can be distributed into the fabrication chambers A22, A27 and A28 for processing, so as to improve the fabrication efficiency.

The fabrication chambers A13, A14 and A18 in the first fabrication chamber unit DY12 corresponding to the service phase 2 and the fabrication chambers A23 and A25 in the second fabrication chamber unit DY23 corresponding to the service phase 3 may define a second combination ZH21. In this way, based on the information of the service phase 2 carried by the target objects T2, the second combination ZH21 corresponding to the first fabrication chamber unit DY12 can be selected from the combinations. Then, according to the second combination ZH21, the fabrication chambers A23 and A25 in the second fabrication chamber unit DY23 corresponding to the service phase 3 are determined as the fabrication chambers corresponding to the target objects T2. In this way, the target objects T2 can be distributed into the fabrication chambers A23 and A25 for processing, so as to improve the fabrication efficiency.

The fabrication chambers A12 and A16 in the first fabrication chamber unit DY13 corresponding to the service phase 3 and the fabrication chambers A21, A24 and A26 in the second fabrication chamber unit DY21 corresponding to the service phase 1 may define a third combination ZH31. In this way, based on the information of the service phase 3 carried by the target objects T3, the third combination ZH31 corresponding to the first fabrication chamber unit DY13 can be selected from the combinations. Then, according to the third combination ZH31, the fabrication chambers A21, A24 and A26 in the second fabrication chamber unit DY21 corresponding to the service phase 1 are determined as the fabrication chambers corresponding to the target objects T3. In this way, the target objects T3 can be distributed into the fabrication chambers A21, A24 and A26 for processing, so as to improve the fabrication efficiency.

In a second embodiment of the present disclosure, a combination of a first fabrication chamber unit corresponding to a service phase p and a second fabrication chamber unit corresponding to a service phase N−p+1 may be taken as a fourth combination, where p is an integer, and $1 \leq P \leq N$. In this way, based on the information of the service phase p carried by the target objects, the fourth combination can be selected from the combinations, and it is determined that the target objects carrying the information of the service phase p are corresponding to the second fabrication chamber unit corresponding to the service phase N−p+1.

Figure 7:
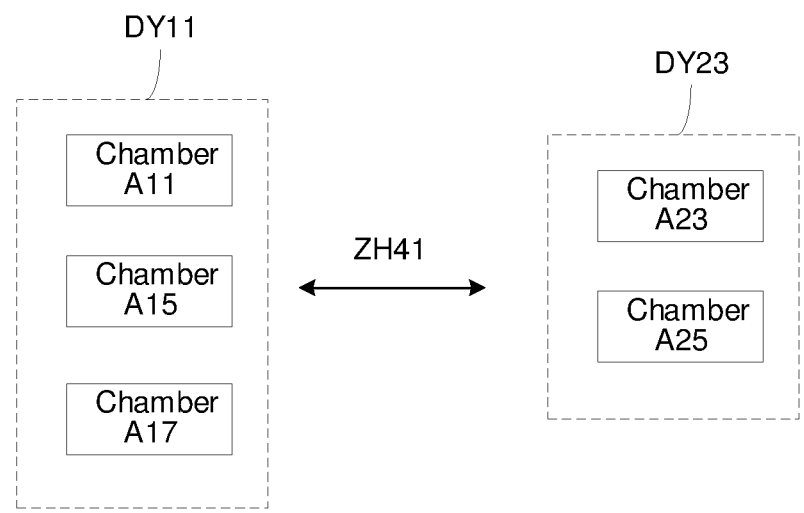
FIG. 7 is a schematic diagram of a fourth combination according to an embodiment of the present disclosure.
Figure 7:
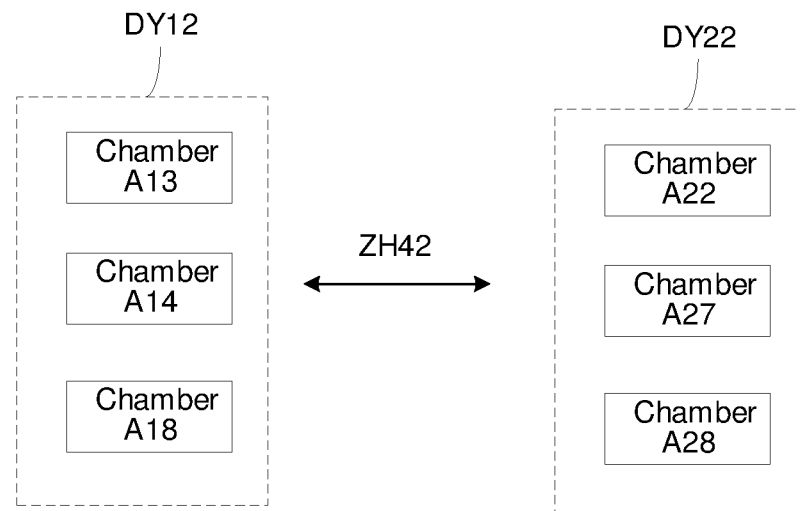
Figure 7:
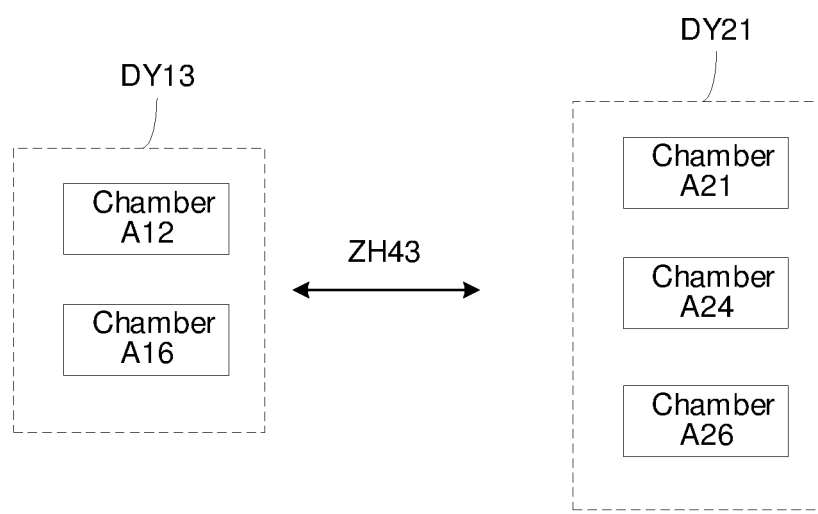

FIG. 7 is a schematic diagram of a fourth combination according to an embodiment of the present disclosure.

Exemplarily, referring to FIG. 7, taking N=3 as an example, the fabrication chambers A11, A15 and A17 in the first fabrication chamber unit DY11 corresponding to the service phase 1 and the fabrication chambers A23 and A25 in the second fabrication chamber unit DY23 corresponding to the service phase 3 may define a fourth combination ZH41. In this way, based on the information of the service phase 1 carried by the target objects T1, the fourth combination ZH41 corresponding to the first fabrication chamber unit DY11 can be selected from the combinations. Then, according to the fourth combination ZH41, the fabrication chambers A23 and A25 in the second fabrication chamber unit DY23 corresponding to the service phase 3 are determined as the fabrication chambers corresponding to the target objects T1. In this way, the target objects T1 can be distributed into the fabrication chambers A23 and A25 for processing, so as to improve the fabrication efficiency.

The fabrication chambers A13, A14 and A18 in the first fabrication chamber unit DY12 corresponding to the service phase 2 and the fabrication chambers A22, A27 and A28 in the second fabrication chamber unit DY22 corresponding to the service phase 2 may define a fourth combination ZH42. In this way, based on the information of the service phase 2 carried by the target objects T2, the fourth combination ZH42 corresponding to the first fabrication chamber unit DY12 can be selected from the combinations. Then, according to the fourth combination ZH42, the fabrication chambers A22, A27 and A28 in the second fabrication chamber unit DY22 corresponding to the service phase 2 are determined as the fabrication chambers corresponding to the target objects T2. In this way, the target objects T2 can be distributed into the fabrication chambers A22, A27 and A28 for processing, so as to improve the fabrication efficiency.

The fabrication chambers A12 and A16 in the first fabrication chamber unit DY13 corresponding to the service phase 3 and the fabrication chambers A21, A24 and A26 in the second fabrication chamber unit DY21 corresponding to the service phase 1 may define a fourth combination ZH43. In this way, based on the information of the service phase 3 carried by the target objects T3, the fourth combination ZH43 corresponding to the first fabrication chamber unit DY13 can be selected from the combinations. Then, according to the fourth combination ZH43, the fabrication chambers A21, A24 and A26 in the second fabrication chamber unit DY21 corresponding to the service phase 1 are determined as the fabrication chambers corresponding to the target objects T3. In this way, the target objects T3 can be distributed into the fabrication chambers A21, A24 and A26 for processing, so as to improve the fabrication efficiency.

In a third embodiment of the present disclosure, when N is an odd number, a combination of a first fabrication chamber unit corresponding to a service phase m and a second fabrication chamber unit corresponding to the service phase $$m + \frac{N-1}{2}$$

may be taken as a fifth combination, where m is an integer, and $$1 \leq m \leq \frac{N+1}{2}.$$

In this way, based on the information of the service phase m carried by the target objects, the fifth combination can be selected from the combinations, and it is determined that the target objects carrying the information of the service phase m are corresponding to the second fabrication chamber unit corresponding to the service phase $$m + \frac{N-1}{2}.$$

A combination of a first fabrication chamber unit corresponding to a service phase q and a second fabrication chamber unit corresponding to a service phase $$q - \frac{N+1}{2}$$

may be taken as a sixth combination, where q is an integer, and $$\frac{N+3}{2} \leq q \leq N.$$

In this way, based on the information of the service phase q carried by the target objects, the sixth combination can be selected from the combinations, and it is determined that the target objects carrying the information of the service phase q are corresponding to the second fabrication chamber unit corresponding to the service phase $$q - \frac{N+1}{2}.$$

Figure 8:
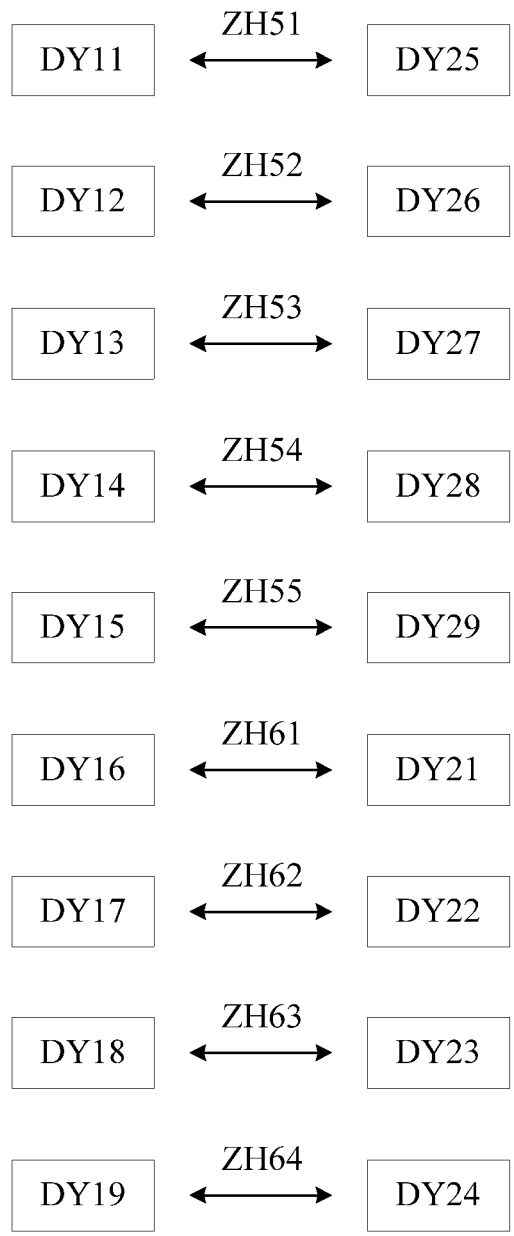
FIG. 8 is a schematic diagram of a fifth combination and a sixth combination according to an embodiment of the present disclosure.

FIG. 8 is a schematic diagram of a fifth combination and a sixth combination according to an embodiment of the present disclosure.

Exemplarily, referring to FIG. 8, taking N=9 as an example, the fabrication chambers in the first fabrication chamber unit DY11 corresponding to the service phase 1 and the fabrication chambers in the second fabrication chamber unit DY25 corresponding to the service phase 5 may define a fifth combination ZH51. In this way, based on the information of the service phase 1 carried by the target objects T1, the fifth combination ZH51 corresponding to the first fabrication chamber unit DY11 can be selected from the combinations. Then, the fabrication chambers in the second fabrication chamber unit DY25 corresponding to the service phase 5 are determined as the fabrication chambers corresponding to the target objects T1. In this way, the target objects T1 can be distributed into the determined fabrication chambers for processing, so as to improve the fabrication efficiency.

The fabrication chambers in the first fabrication chamber unit DY12 corresponding to the service phase 2 and the fabrication chambers in the second fabrication chamber unit DY26 corresponding to the service phase 6 may define a fifth combination ZH52. In this way, based on the information of the service phase 2 carried by the target objects T2, the fifth combination ZH52 corresponding to the first fabrication chamber unit DY12 can be selected from the combinations. Then, the fabrication chambers in the second fabrication chamber unit DY26 corresponding to the service phase 6 are determined as the fabrication chambers corresponding to the target objects T2. In this way, the target objects T2 can be distributed into the determined fabrication chambers for processing, so as to improve the fabrication efficiency.

The fabrication chambers in the first fabrication chamber unit DY13 corresponding to the service phase 3 and the fabrication chambers in the second fabrication chamber unit DY27 corresponding to the service phase 7 may define a fifth combination ZH53. In this way, based on the information of the service phase 3 carried by the target objects T3, the fifth combination ZH53 corresponding to the first fabrication chamber unit DY13 can be selected from the combinations. Then, the fabrication chambers in the second fabrication chamber unit DY27 corresponding to the service phase 7 are determined as the fabrication chambers corresponding to the target objects T3. In this way, the target objects T3 can be distributed into the determined fabrication chambers for processing, so as to improve the fabrication efficiency.

The fabrication chambers in the first fabrication chamber unit DY14 corresponding to the service phase 4 and the fabrication chambers in the second fabrication chamber unit DY28 corresponding to the service phase 8 may define a fifth combination ZH54. In this way, based on the information of the service phase 4 carried by the target objects T4, the fifth combination ZH54 corresponding to the first fabrication chamber unit DY14 can be selected from the combinations. Then, the fabrication chambers in the second fabrication chamber unit DY28 corresponding to the service phase 8 are determined as the fabrication chambers corresponding to the target objects T4. In this way, the target objects T4 can be distributed into the determined fabrication chambers for processing, so as to improve the fabrication efficiency.

The fabrication chambers in the first fabrication chamber unit DY15 corresponding to the service phase 5 and the fabrication chambers in the second fabrication chamber unit DY29 corresponding to the service phase 9 may define a fifth combination ZH55. In this way, based on the information of the service phase 5 carried by the target objects T5, the fifth combination ZH55 corresponding to the first fabrication chamber unit DY15 can be selected from the combinations. Then, the fabrication chambers in the second fabrication chamber unit DY29 corresponding to the service phase 9 are determined as the fabrication chambers corresponding to the target objects T5. In this way, the target objects T5 can be distributed into the determined fabrication chambers for processing, so as to improve the fabrication efficiency.

The fabrication chambers in the first fabrication chamber unit DY16 corresponding to the service phase 6 and the fabrication chambers in the second fabrication chamber unit DY21 corresponding to the service phase 1 may define a sixth combination ZH61. In this way, based on the information of the service phase 6 carried by the target objects T6, the sixth combination ZH61 corresponding to the first fabrication chamber unit DY16 can be selected from the combinations. Then, the fabrication chambers in the second fabrication chamber unit DY21 corresponding to the service phase 1 are determined as the fabrication chambers corresponding to the target objects T6. In this way, the target objects T6 can be distributed into the determined fabrication chambers for processing, so as to improve the fabrication efficiency.

The fabrication chambers in the first fabrication chamber unit DY17 corresponding to the service phase 7 and the fabrication chambers in the second fabrication chamber unit DY22 corresponding to the service phase 2 may define a sixth combination ZH62. In this way, based on the information of the service phase 7 carried by the target objects T7, the sixth combination ZH62 corresponding to the first fabrication chamber unit DY17 can be selected from the combinations. Then, the fabrication chambers in the second fabrication chamber unit DY22 corresponding to the service phase 2 are determined as the fabrication chambers corresponding to the target objects T7. In this way, the target objects T7 can be distributed into the determined fabrication chambers for processing, so as to improve the fabrication efficiency.

The fabrication chambers in the first fabrication chamber unit DY18 corresponding to the service phase 8 and the fabrication chambers in the second fabrication chamber unit DY23 corresponding to the service phase 3 may define a sixth combination ZH63. In this way, based on the information of the service phase 8 carried by the target objects T8, the sixth combination ZH63 corresponding to the first fabrication chamber unit DY18 can be selected from the combinations. Then, the fabrication chambers in the second fabrication chamber unit DY23 corresponding to the service phase 3 are determined as the fabrication chambers corresponding to the target objects T8. In this way, the target objects T8 can be distributed into the determined fabrication chambers for processing, so as to improve the fabrication efficiency.

The fabrication chambers in the first fabrication chamber unit DY19 corresponding to the service phase 9 and the fabrication chambers in the second fabrication chamber unit DY24 corresponding to the service phase 4 may define a sixth combination ZH64. In this way, based on the information of the service phase 9 carried by the target objects T9, the sixth combination ZH64 corresponding to the first fabrication chamber unit DY19 can be selected from the combinations. Then, the fabrication chambers in the second fabrication chamber unit DY24 corresponding to the service phase 4 are determined as the fabrication chambers corresponding to the target objects T9. In this way, the target objects T9 can be distributed into the determined fabrication chambers for processing, so as to improve the fabrication efficiency.

In a third embodiment of the present disclosure, when N is an even number, A combination of a first fabrication chamber unit corresponding to a service phase g and a second fabrication chamber unit corresponding to a service phase $$g + \frac{N}{2}$$

may be taken as a seventh combination, where g is an integer, and $$1 \leq g \leq \frac{N}{2}.$$

In this way, based on the information of the service phase g carried by the target objects, the seventh combination can be selected from the combinations, and it is determined that the target objects carrying the information of the service phase g are corresponding to the second fabrication chamber unit corresponding to the service phase $$g + \frac{N}{2}.$$

A combination of a first fabrication chamber unit corresponding to a service phase h and a second fabrication chamber unit corresponding to a service phase $$h - \frac{N}{2}$$

may be taken as an eighth combination, where h is an integer, and $$\frac{N+2}{2} \leq h \leq N.$$

In this way, based on the information of the service phase h carried by the target objects, the eighth combination can be selected from the combinations, and it is determined that the target objects carrying the information of the service phase h are corresponding to the second fabrication chamber unit corresponding to the service phase $$h - \frac{N}{2}.$$

Figure 9:
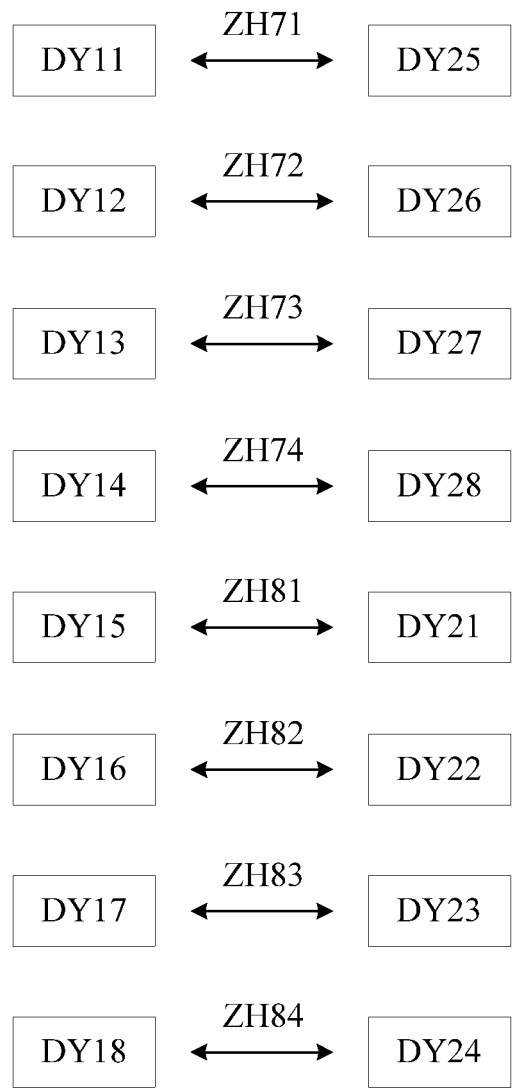
FIG. 9 is a schematic diagram of a seventh combination and an eighth combination according to an embodiment of the present disclosure.

FIG. 9 is a schematic diagram of a seventh combination and an eighth combination according to an embodiment of the present disclosure.

Exemplarily, referring to FIG. 9, taking N=8 as an example, the fabrication chambers in the first fabrication chamber unit DY11 corresponding to the service phase 1 and the fabrication chambers in the second fabrication chamber unit DY25 corresponding to the service phase 5 may define a seventh combination ZH71. In this way, based on the information of the service phase 1 carried by the target objects T1, the seventh combination ZH71 corresponding to the first fabrication chamber unit DY11 can be selected from the combinations. Then, the fabrication chambers in the second fabrication chamber unit DY25 corresponding to the service phase 5 are determined as the fabrication chambers corresponding to the target objects T1. In this way, the target objects T1 can be distributed into the determined fabrication chambers for processing, so as to improve the fabrication efficiency.

The fabrication chambers in the first fabrication chamber unit DY12 corresponding to the service phase 2 and the fabrication chambers in the second fabrication chamber unit DY26 corresponding to the service phase 6 may define a seventh combination ZH72. In this way, based on the information of the service phase 2 carried by the target objects T2, the seventh combination ZH72 corresponding to the first fabrication chamber unit DY12 can be selected from the combinations. Then, the fabrication chambers in the second fabrication chamber unit DY26 corresponding to the service phase 6 are determined as the fabrication chambers corresponding to the target objects T2. In this way, the target objects T2 can be distributed into the determined fabrication chambers for processing, so as to improve the fabrication efficiency.

The fabrication chambers in the first fabrication chamber unit DY13 corresponding to the service phase 3 and the fabrication chambers in the second fabrication chamber unit DY27 corresponding to the service phase 7 may define a seventh combination ZH73. In this way, based on the information of the service phase 3 carried by the target objects T3, the seventh combination ZH73 corresponding to the first fabrication chamber unit DY13 can be selected from the combinations. Then, the fabrication chambers in the second fabrication chamber unit DY27 corresponding to the service phase 7 are determined as the fabrication chambers corresponding to the target objects T3. In this way, the target objects T3 can be distributed into the determined fabrication chambers for processing, so as to improve the fabrication efficiency.

The fabrication chambers in the first fabrication chamber unit DY14 corresponding to the service phase 4 and the fabrication chambers in the second fabrication chamber unit DY28 corresponding to the service phase 8 may define a seventh combination ZH74. In this way, based on the information of the service phase 4 carried by the target objects T4, the seventh combination ZH74 corresponding to the first fabrication chamber unit DY14 can be selected from the combinations. Then, the fabrication chambers in the second fabrication chamber unit DY28 corresponding to the service phase 8 are determined as the fabrication chambers corresponding to the target objects T4. In this way, the target objects T4 can be distributed into the determined fabrication chambers for processing, so as to improve the fabrication efficiency.

The fabrication chambers in the first fabrication chamber unit DY15 corresponding to the service phase 5 and the fabrication chambers in the second fabrication chamber unit DY21 corresponding to the service phase 1 may define an eighth combination ZH81. In this way, based on the information of the service phase 5 carried by the target objects T5, the eighth combination ZH81 corresponding to the first fabrication chamber unit DY15 can be selected from the combinations. Then, the fabrication chambers in the second fabrication chamber unit DY21 corresponding to the service phase 1 are determined as the fabrication chambers corresponding to the target objects T5. In this way, the target objects T5 can be distributed into the determined fabrication chambers for processing, so as to improve the fabrication efficiency.

The fabrication chambers in the first fabrication chamber unit DY16 corresponding to the service phase 6 and the fabrication chambers in the second fabrication chamber unit DY22 corresponding to the service phase 2 may define an eighth combination ZH82. In this way, based on the information of the service phase 6 carried by the target objects T6, the eighth combination ZH82 corresponding to the first fabrication chamber unit DY16 can be selected from the combinations. Then, the fabrication chambers in the second fabrication chamber unit DY22 corresponding to the service phase 2 are determined as the fabrication chambers corresponding to the target objects T6. In this way, the target objects T6 can be distributed into the determined fabrication chambers for processing, so as to improve the fabrication efficiency.

The fabrication chambers in the first fabrication chamber unit DY17 corresponding to the service phase 7 and the fabrication chambers in the second fabrication chamber unit DY23 corresponding to the service phase 3 may define an eighth combination ZH83. In this way, based on the information of the service phase 7 carried by the target objects T7, the eighth combination ZH83 corresponding to the first fabrication chamber unit DY17 can be selected from the combinations. Then, the fabrication chambers in the second fabrication chamber unit DY23 corresponding to the service phase 3 are determined as the fabrication chambers corresponding to the target objects T7. In this way, the target objects T7 can be distributed into the determined fabrication chambers for processing, so as to improve the fabrication efficiency.

The fabrication chambers in the first fabrication chamber unit DY18 corresponding to the service phase 8 and the fabrication chambers in the second fabrication chamber unit DY24 corresponding to the service phase 4 may define an eighth combination ZH84. In this way, based on the information of the service phase 8 carried by the target objects T8, the eighth combination ZH84 corresponding to the first fabrication chamber unit DY18 can be selected from the combinations. Then, the fabrication chambers in the second fabrication chamber unit DY24 corresponding to the service phase 4 are determined as the fabrication chambers corresponding to the target objects T8. In this way, the target objects T8 can be distributed into the determined fabrication chambers for processing, so as to improve the fabrication efficiency.

Figure 10:
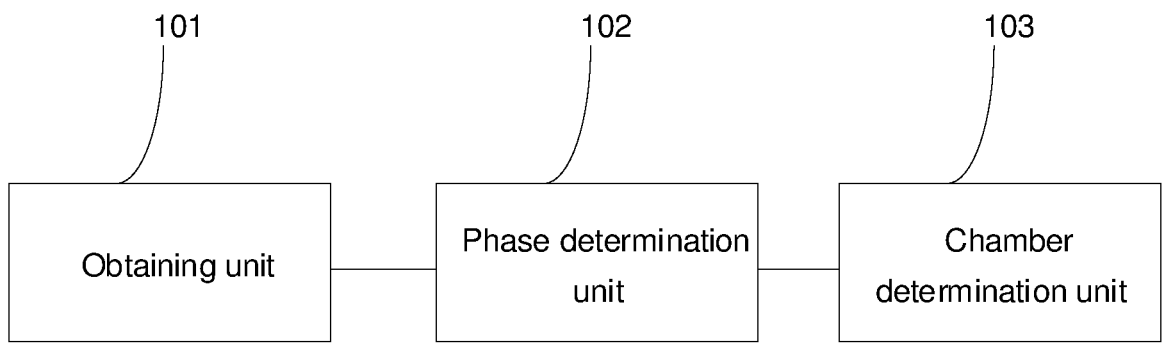
FIG. 10 is a schematic diagram of a device for determining a fabrication chamber according to an embodiment of the present disclosure.

FIG. 10 is a schematic diagram of a device for determining a fabrication chamber according to an embodiment of the present disclosure.

Referring to FIG. 10, an embodiment of the present disclosure further provides a device for determining a fabrication chamber, which may include: an obtaining unit 101, a phase determination unit 102 and a chamber determination unit 103.

In the embodiment of the present disclosure, the obtaining unit is configured to obtain a current RF power time of each fabrication chamber in a current process step and a next process step, respectively.

In the embodiment of the present disclosure, the phase determination unit is configured to determine a service phase of a current RF power time of each of the fabrication chambers according to the current RF power time and set consecutive multiple service phases of each fabrication chamber. The multiple consecutive service phases are divided based on a service period of each of the fabrication chambers, and the service period of each of the fabrication chambers is from the end of a current cleaning to the beginning of a next cleaning.

In the embodiment of the present disclosure, the chamber determination unit is configured to determine a fabrication chamber for the next process step corresponding to a target object according to the service phase of the current RF power time of each of the fabrication chambers. The target objects are objects processed by the fabrication chambers in the current process step.

Those skilled in the art should understand that the embodiments of the present disclosure may be provided as a method, a system or a computer program product. Therefore, the present disclosure may use a form of hardware only examples, software only examples, or examples with a combination of software and hardware. Moreover, the present disclosure may use a form of a computer program product that is implemented on one or more computer-usable storage media, including but not limited to a magnetic disk memory and a compact disc read-only memory (CD-ROM), which include computer-usable program code.

The present disclosure is described with reference to the flowcharts and/or block diagrams of the method, the device (system) and the computer program product according to the embodiments of the present disclosure. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, such that the instructions executed by a computer or a processor of any other programmable data processing device generate an apparatus for implementing a specific function in one or more processes in the flowcharts and/or in one or more blocks in the block diagrams.

These computer program instructions may be stored in a computer readable memory that can instruct the computer or any other programmable data processing device to work in a specific manner, such that the instructions stored in the computer readable memory generate an artifact that includes an instruction apparatus. The instruction apparatus implements a specific function in one or more processes in the flowcharts and/or in one or more blocks in the block diagrams.

These computer program instructions may be loaded onto a computer or another programmable data processing device, such that a series of operations and steps are performed on the computer or the another programmable device, thereby generating computer-implemented processing. Therefore, the instructions executed on the computer or other programmable devices provide steps for implementing a specific function in one or more processes in the flowcharts and/or in one or more blocks in the block diagrams.

The preferred embodiments of the present disclosure are described above. However, those skilled in the art can make changes and modifications to these embodiments once they learn the basic inventive concept of the present disclosure. Therefore, the appended claims are intended to be interpreted as including the preferred embodiments and all changes and modifications falling within the scope of the present disclosure.

Apparently, those skilled in the art can make various modifications and variations to the present disclosure without departing from the spirit and scope of the present disclosure. The present disclosure is intended to cover these modifications and variations provided that they fall within the scope of protection defined by the claims of the present disclosure or equivalents thereof.

The invention claimed is:

1. A method for determining a fabrication chamber, comprising:
    obtaining a current radio frequency power time of each fabrication chamber in a current process step, and obtaining a current radio frequency power time of each fabrication chamber to be selected for a next process step;
    determining a service phase for the current radio frequency power time of each of the fabrication chambers in the current process step and a service phase for the current radio frequency power time of each of the fabrication chambers to be selected according to the current radio frequency power time of each of the fabrication chambers in the current process step, the current radio frequency power time of each of the fabrication chambers to be selected and multiple consecutive service phases set, wherein the multiple consecutive service phases are divided based on a service period of each of the fabrication chambers, and the service period of each of the fabrication chambers is from an end of a current cleaning to a beginning of a next cleaning; and
    determining fabrication chambers for target objects to enter in the next process step from the fabrication chambers to be selected according to the service phase of the current radio frequency power time of each of the fabrication chambers in the current process step and the service phase of the current radio frequency power time of each of the fabrication chambers to be selected, wherein the target objects are objects processed by the fabrication chambers in the current process step.

2. The method for determining a fabrication chamber according to claim 1, wherein the multiple consecutive service phases comprise a service phase 1 to a service phase N appearing in sequence, the N being an integer greater than 1;
    the determining fabrication chambers for target objects to enter in the next process step from the fabrication chambers to be selected comprises:
        dividing the fabrication chambers in the current process step into multiple first fabrication chamber units and the fabrication chambers to be selected for the next process step into multiple second fabrication chamber units according to the service phase of the current radio frequency power time of each of the fabrication chambers, wherein the multiple first fabrication chamber units correspond to the service phases one to one, and the multiple second fabrication chamber units correspond to the service phases one to one;
        combining the multiple first fabrication chamber units with the multiple second fabrication chamber units, wherein a first fabrication chamber unit corresponding to the service phase 1 is combined with a second fabrication chamber unit corresponding to a service phase other than the service phase 1; and
        determining the fabrication chambers for the target objects to enter in the next process step from combinations based on the target objects.

3. The method for determining a fabrication chamber according to claim 2, after the determining a service phase for the current radio frequency power time of each of the fabrication chambers in the current process step, and before the determining the fabrication chambers for the target objects to enter in the next process step from combinations, the method further comprises:
    adding an identification tag to the target objects processed by the fabrication chambers in the current process step, wherein the identification tag carries information of a corresponding service phase of the fabrication chambers where the target objects are processed; and
    the determining the fabrication chambers for the target objects to enter in the next process step from combinations comprises:
        determining the fabrication chambers for the target objects to enter in the next process step from the combinations based on the identification tag carried by the target objects.

4. The method for determining a fabrication chamber according to claim 3, wherein the combining the multiple first fabrication chamber units with the multiple second fabrication chamber units comprises:
    combining the first fabrication chamber unit corresponding to the service phase 1 with at least one of the second fabrication chamber units corresponding to a service phase 2 to the service phase N; and
    combining each first fabrication chamber unit corresponding to the service phase 2 to the service phase N with at least one of second fabrication chamber units corresponding to the service phase 1 to the service phase N, wherein the at least one second fabrication chamber unit combined with the first fabrication chamber unit corresponding to the service phase 1 is different from the at least one second fabrication chamber unit combined with each of the first fabrication chamber units corresponding to the service phase 2 to the service phase N.

5. The method for determining a fabrication chamber according to claim 4, wherein the determining the fabrication chambers for the target objects to enter in the next process step from the combinations based on the identification tag carried by the target objects comprises:
    selecting a first combination from the combinations based on information of the service phase 1 carried by the target objects, and determining that the target objects carrying the information of the service phase 1 are corresponding to a second fabrication chamber unit corresponding to the service phase 2, wherein the first combination is a combination of the first fabrication chamber unit corresponding to the service phase 1 and the second fabrication chamber unit corresponding to the service phase 2;

selecting a second combination from the combinations based on information of a service phase k carried by the target objects, and determining that the target objects carrying the information of the service phase k are corresponding to a second fabrication chamber unit corresponding to a service phase k+1, wherein the second combination is a combination of a first fabrication chamber unit corresponding to the service phase k and the second fabrication chamber unit corresponding to the service phase k+1, the k being an integer, 1<the k<the N; and selecting a third combination from the combinations based on information of the service phase N carried by the target objects, and determining that the target objects carrying the information of the service phase N are corresponding to a second fabrication chamber unit corresponding to the service phase 1, wherein the third combination is a combination of a first fabrication chamber unit corresponding to the service phase N and the second fabrication chamber unit corresponding to the service phase 1.

6. The method for determining a fabrication chamber according to claim 4, wherein the determining the fabrication chambers for the target objects to enter in the next process step from the combinations based on the identification tag carried by the target objects comprises:

selecting a fourth combination from the combinations based on information of a service phase p carried by the target objects, and determining that the target objects carrying the information of the service phase p are corresponding to a second fabrication chamber unit corresponding to a service phase N−p+1, wherein the fourth combination is a combination of a first fabrication chamber unit corresponding to the service phase p and the second fabrication chamber unit corresponding to the service phase N−p+1, the p being an integer, 1≤the p≤the N.

7. The method for determining a fabrication chamber according to claim 4, when the N is an odd number, the determining the fabrication chambers for the target objects to enter in the next process step from the combinations based on the identification tag carried by the target objects comprises:

selecting a fifth combination from the combinations based on information of a service phase m carried by the target objects, and determining that the target objects carrying the information of the service phase m are corresponding to a second fabrication chamber unit corresponding to a service phase $$m + \frac{N-1}{2},$$

wherein the fifth combination is a combination of a first fabrication chamber unit corresponding to the service phase m and the second fabrication chamber unit corresponding to the service phase $$m + \frac{N-1}{2},$$

the m being an integer, $$1 \le \text{the } m \le \frac{N+1}{2};$$

and selecting a sixth combination from the combinations based on information of a service phase q carried by the target objects, and determining that the target objects carrying the information of the service phase q are corresponding to a second fabrication chamber unit corresponding to a service phase $$q - \frac{N+1}{2},$$

wherein the sixth combination is a combination of a first fabrication chamber unit corresponding to the service phase q and the second fabrication chamber unit corresponding to the service phase $$q - \frac{N+1}{2},$$

the q being an integer, $$\frac{N+3}{2} \le \text{the } q \le \text{the } N.$$

8. The method for determining a fabrication chamber according to claim 4, when the N is an even number, the determining the fabrication chambers for the target objects to enter in the next process step from the combinations based on the identification tag carried by the target objects comprises:

selecting a seventh combination from the combinations based on information of a service phase g carried by the target objects, and determining that the target objects carrying the information of the service phase g are corresponding to a second fabrication chamber unit corresponding to a service phase $$g + \frac{N}{2},$$

wherein the seventh combination is a combination of a first fabrication chamber unit corresponding to the service phase g and the second fabrication chamber unit corresponding to the service phase $$g + \frac{N}{2},$$

the g being an integer, $$1 \le \text{the } g \le \frac{N}{2};$$

and
selecting an eighth combination from the combinations based on information of a service phase h carried by the target objects, and determining that the target objects carrying the information of the service phase h are corresponding to a second fabrication chamber unit corresponding to a service phase $$h - \frac{N}{2},$$

wherein the eighth combination is a combination of a first fabrication chamber unit corresponding to the service phase h and the second fabrication chamber unit corresponding to the service phase $$h - \frac{N}{2},$$

the h being an integer, $$\frac{N+2}{2} \le \text{the } h \le \text{the } N.$$

9. The method for determining a fabrication chamber according to claim 1, wherein the multiple consecutive service phases have a same duration; alternatively,
among the multiple consecutive service phases, a duration of a previous service phase is greater than a duration of a latter service phase; alternatively,
among the multiple consecutive service phases, a duration of an intermediate service phase is greater than a duration of a service phase at either end.

10. The method for determining a fabrication chamber according to claim 1, wherein the fabrication chambers have a same number of the service phases.

11. The method for determining a fabrication chamber according to claim 10, for each of the fabrication chambers corresponding to the current process step, a same sequential service phase has a same range; and/or
for each of the fabrication chambers corresponding to the next process step, a same sequential service phase has a same range.

12. The method for determining a fabrication chamber according to claim 11, for all fabrication chambers, a same sequential service phase has a same range.

13. The method for determining a fabrication chamber according to claim 1, wherein a process step comprises an etching step;
the current process step comprises a mask etching process step in a fabrication process of capacitor holes;
the next process step comprises a support layer etching process step in the fabrication process of the capacitor holes;
the obtaining a current radio frequency power time of each fabrication chamber in a current process step comprises:

obtaining a current radio frequency power time of each fabrication chamber in a current etching step when an etching process is completed in the fabrication chambers corresponding to the current etching step; and the obtaining a current radio frequency power time of each fabrication chamber to be selected for a next process step comprises:

obtaining a current radio frequency power time of each fabrication chamber to be selected for a next etching step before the fabrication chambers corresponding to the next etching step start an etching process.

14. The method for determining a fabrication chamber according to claim 1, after the determining fabrication chambers for target objects to enter in the next process step from the fabrication chambers to be selected, the method further comprises:

sending the target objects to the fabrication chambers corresponding to the next process step.

15. A device for determining a fabrication chamber, comprising:

an obtaining unit, configured to obtain a current radio frequency power time of each fabrication chamber in a current process step, and obtain a current radio frequency power time of each fabrication chamber to be selected for a next process step;

a phase determination unit, configured to determine a service phase for the current radio frequency power time of each of the fabrication chambers in the current process step and a service phase for the current radio frequency power time of each of the fabrication chambers to be selected according to the current radio frequency power time of each of the fabrication chambers in the current process step, the current radio frequency power time of each of the fabrication chambers to be selected and multiple consecutive service phases set, wherein the multiple consecutive service phases are divided based on a service period of each of the fabrication chambers, and the service period of each of the fabrication chambers is from an end of a current cleaning to a beginning of a next cleaning; and a chamber determination unit, configured to determine fabrication chambers for target objects to enter in the next process step from the fabrication chambers to be selected according to the service phase of the current radio frequency power time of each of the fabrication chambers in the current process step and the service phase of the current radio frequency power time of each of the fabrication chambers to be selected, wherein the target objects are objects processed by the fabrication chambers in the current process step.

* * * * *